（12）United States Patent
Xie

(10) Patent No.: US 8,576,105 B1
(45) Date of Patent: Nov. 5, 2013

(54) METHOD AND APPARATUS FOR TIMING RECOVERY

(75) Inventor: Jin Xie, Longmont, CO (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/419,938

(22) Filed: Mar. 14, 2012

Related U.S. Application Data

(60) Provisional application No. 61/466,701, filed on Mar. 23, 2011.

(51) Int. Cl.
*H03M 1/12* (2006.01)
(52) U.S. Cl.
USPC .......................................... 341/155; 375/327
(58) Field of Classification Search
USPC ................ 341/155; 375/327, 376; 369/275.3, 369/275.4, 47.48, 47.1, 59.2, 59.19
See application file for complete search history.

(56) References Cited

U.S. PATENT DOCUMENTS 8,339,917 B1 * 12/2012 Xie et al. ...................... 369/59.2
2007/0092040 A1 * 4/2007 Higashino .................... 375/327

* cited by examiner

*Primary Examiner* — Joseph Lauture

(57) ABSTRACT

An aspect of the disclosure provides a signal processing circuit that decouples a timing loop and an equalizer adaptation loop. The signal processing circuit includes an analog to digital converter (ADC), an equalizer, a detector, and a timing module. The ADC is configured to receive an analog signal, sample the analog signal based on a sampling clock signal, and convert the sampled analog signal into a digital signal. The equalizer is configured to equalize the digital signal. The detector is configured to detect a bit stream from the equalized digital signal. The timing module is configured to detect a timing error based on the digital signal before being equalized, and to adjust the sampling clock signal based on the timing error.

20 Claims, 4 Drawing Sheets

METHOD AND APPARATUS FOR TIMING RECOVERY

INCORPORATION BY REFERENCE

This present disclosure claims the benefit of U.S. Provisional Application No. 61/466,701, "LMS-decoupled Timing Recovery," filed on Mar. 23, 2011, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Timing recovery techniques are used in electronic devices, such as communication devices, storage devices, and the like, to recover digital data from electrical signals. In an example, an optical storage device includes a read channel that receives an electrical signal corresponding to data stored on an optical storage medium. The read channel can include a timing recovery circuit to generate a timing signal based on the electrical signal. The timing signal is used to sample the electrical signal to extract the digital data stored on the optical storage medium.

SUMMARY

Aspects of the disclosure provide a signal processing circuit. The signal processing circuit includes an analog to digital converter (ADC), an equalizer, a detector, and a timing module. The ADC is configured to receive an analog signal, sample the analog signal based on a sampling clock signal, and convert the sampled analog signal into a digital signal. The equalizer is configured to equalize the digital signal. The detector is configured to detect a bit stream from the equalized digital signal. The timing module is configured to detect a timing error based on the digital signal before being equalized, and to adjust the sampling clock signal based on the timing error.

According to an aspect of the disclosure, the timing module includes a first convolve module and a timing error detector. The first convolve module is configured to convolve the bit stream with a pulse response of the signal processing circuit to generate a first convolved signal, and the timing error detector is configured to detect the timing error based on a difference between the digital signal before being equalized and the first convolved signal. In an embodiment, the timing module includes a pulse response adaptation module configured to adapt the pulse response based on the first convolved signal and the digital signal before being equalized. In an example, the pulse response adaptation module is configured to avoid adaptation to the timing error.

According to another aspect of the disclosure, the equalizer includes a finite impulse response (FIR) digital filter, and the signal processing circuit includes an adaptation controller configured to adaptively adjust coefficients of the FIR digital filter based on the equalized digital signal. In an embodiment, the adaptation controller includes a second convolve module configured to convolve the bit stream with a target to generate a second convolved signal, and the coefficients of the FIR digital filter is adaptively adjusted based on the equalized digital signal and the second convolved signal. In an example, the adaptation controller is configured to adaptively adjust the coefficients of the FIR digital filter to achieve least mean squares between the equalized digital signal and the second convolved signal.

Aspects of the disclosure also provide a method. The method includes receiving an analog signal, sampling and converting, based on a sampling clock signal, the analog signal into a digital signal, equalizing the digital signal, detecting a bit stream from the equalized digital signal, detecting a timing error based on the digital signal before being equalized, and adjusting the sampling clock signal based on the timing error.

Aspects of the disclosure also provide an electronic system. The electronic system includes a pick-up unit, an analog signal processing circuit, an analog to digital converter (ADC), an equalizer, a detector, and a timing module. The pick-up unit is configured to generate an electrical signal corresponding to a bit stream. The analog signal processing circuit is configured to generate an analog signal based on the electrical signal. The ADC is configured to sample the analog signal based on a sampling clock signal, and convert the sampled analog signal into a digital signal. The equalizer is configured to equalize the digital signal. The detector is configured to detect a bit stream from the equalized digital signal. The timing module is configured to detect a timing error based on the digital signal before being equalized, and to adjust the sampling clock signal based on the timing error.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
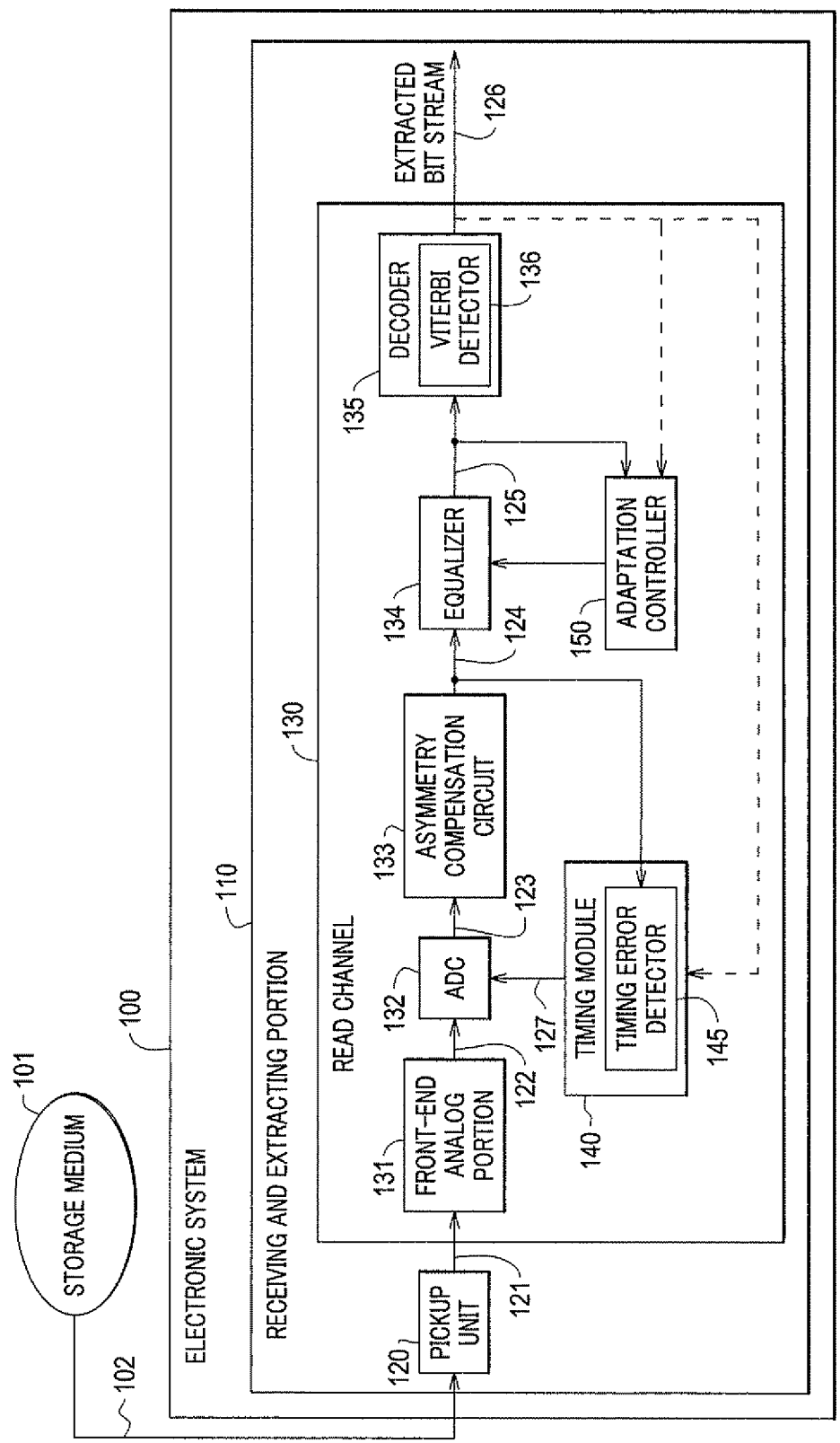
FIG. 1 shows a block diagram of an electronic system example 100 according to an embodiment of the disclosure.

FIG. 1 shows a block diagram of an electronic system example 100 according to an embodiment of the disclosure. The electronic system 100 includes a receiving and extracting portion 110 that receives a signal 102 corresponding to a bit stream. The receiving and extracting portion 110 processes the signal 102 and extracts the bit stream from the signal 102.

In an embodiment, the receiving and extracting portion 110 includes a pick-up unit 120 and a read channel 130. The pick-up unit 120 receives the signal 102 and suitably generates an electrical signal 121 in response to the signal 102. The read channel 130 includes signal processing circuits to process the electrical signal 121, and extract the bit stream.

It is noted that the signal 102 can be any suitable signal. In an embodiment, the signal 102 is generated in response to a bit stream stored on a storage medium 101. It is noted that the storage medium 101 can be any suitable storage medium. In an example, the storage medium 101 is a hard disk drive that stores the bit stream as magnetic field changes. The pick-up unit 120 includes a magnetic head that generates the electrical signal 121 in response to the magnetic field changes on the storage medium 101. The read channel 130 processes the electrical signal 121 and extracts the bit stream.

In another example, the storage medium 101 is an optical disc, such as a compact disc (CD), a digital versatile disc (DVD), a Blu-ray disc, or the like, that stores the bit stream as optical property changes. The pick-up unit 120 is an optical pick-up unit that generates the electrical signal 121 in response to the optical property changes. Specifically, the pick-up unit 120 directs a light beam to the storage medium 101. The light beam is reflected from the storage medium 101. The signal 102, which is the reflected light beam, has light properties that correspond to the optical property changes on the storage medium 101. The pick-up unit 120 generates the electrical signal 121 in response to the light properties of the signal 102. The read channel 130 processes the electrical signal 121 and extracts the bit stream.

In another embodiment, the signal 102 is an electromagnetic signal transmitted in the air, for example, from a base station (not shown). The pick-up unit 120 includes an antenna that suitably generates the electrical signal 121 in response to the electromagnetic signal 102. The read channel 130 processes the electrical signal 121 and extracts the bit stream.

In the FIG. 1 example, the read channel 130 includes a front-end analog portion 131, an analog-to-digital converter (ADC) 132, an asymmetry compensation circuit 133, an equalizer 134, a decoder 135, a timing module 140 and an adaptation controller 150. These elements are coupled together as shown in FIG. 1.

The front-end analog portion 131 receives the electrical signal 121, regulates the electrical signal 121, and outputs an analog signal 122. The front-end analog portion 131 includes various analog circuits to regulate the electrical signal 121 using analog techniques, such as amplification, compensation for offsets, adjusting an appropriate dynamic range, and the like. In an example, the front-end analog portion 131 includes an offset loop that adjusts offsets of the electrical signal 121. In another example, the front-end analog portion 131 includes a gain loop that adjusts an amplifier gain to regulate the electrical signal 121 to an appropriate dynamic range. Thus, the analog signal 122 is suitable for subsequent circuit components to handle.

The ADC 132 receives the analog signal 122 and samples the analog signal 122 based on a sampling clock 127. The sampling clock 127 is provided by the timing module 140. Further, the ADC 132 converts the sampled analog signal into a digital signal 123.

The asymmetry compensation circuit 133 receives the digital signal 123, performs asymmetry compensation on the digital signal 123, and provides a symmetric digital signal 124 to the equalizer 134.

The equalizer 134 receives the symmetric digital signal 124, equalizes the symmetric digital signal 124 to a desired target response, and provides an equalized digital signal 125 to the decoder 135. In an embodiment, the equalizer 134 is a finite impulse response (FIR) digital filter that is configured to shape the symmetric digital signal 124 according to a target to reduce noises from the symmetric digital signal 124 and control inter-symbol interferences. Thus, data extraction based on the equalized digital signal 125 has a relatively high accuracy.

In an example, the target characterizes a channel for conveying the bit stream. For example, the target collectively characterizes a channel that includes the pick-up unit 120, the front-end analog portion 131, the ADC 132 and the asymmetry compensation circuit 133 for processing the electrical signal 121. It is noted that the target can be fixed, programmable or adaptive.

The decoder 135 extracts a bit stream 126 from the equalized digital signal 125. In an embodiment, the detector 135 includes a Viterbi detector 136. The Viterbi detector 136 detects a bit stream, such as a binary stream, multi-level bit stream, or the like, from equalized digital signal 125. According to an embodiment of the disclosure, when the extracted bit stream 126 is the same as the original bit stream at a data source (e.g., the storage medium 101), which is true most of the time, the extracted bit stream 126 is considered noise free.

The timing module 140 includes a timing error detector 145 configured to detect a timing error from an electrical signal before being processed by the equalizer 134, such as the symmetric digital signal 124, the digital signal 123, or the like. Then, based on the timing error, the timing module 140 adjusts the sampling clock 127. According to an embodiment of the disclosure, the timing error detector 145 uses the extracted bit stream 126 as a noise free signal, and detects the timing error from the symmetric digital signal 124 with reference to the extracted bit stream 126.

In the FIG. 1 example, the timing module 140, the ADC 132, and the asymmetry compensation circuit 133 form a timing loop to track the phase or frequency changes in the analog signal 122, and thus to sample the analog signal 122 at the right timing. It is noted that, in another example, the asymmetry compensation circuit 133 is not included in the timing loop.

In an embodiment, the equalizer 134 is implemented as a finite impulse response (FIR) digital filter that is adaptive. In the FIG. 1 example, the adaptation controller 150 receives the equalized digital signal 125 and a noise free signal, such as the extracted bit stream 126, and adaptively adjusts the coefficients of the FIR digital filter based on the equalized digital signal 125 and the noise free signal. It is noted that the adaptation controller 150 can be implemented as logic circuits or can be implemented as a processor executing software instructions.

The equalizer 134 and the adaptation controller 150 form an adaptation loop to improve the performance of the equalizer 134.

According to an embodiment of the disclosure, the timing loop and the adaptation loop are decoupled, such that the two loops do not interact with each other. Specifically, the timing loop detects and corrects a timing error based on a signal before being equalized, such as the symmetric digital signal 124, and the digital signal 123. Thus, the performance of the equalizer 134 does not affect the timing loop. According to an aspect of the disclosure, the timing loop can be separately tuned from the adaptation loop. Thus, in an example, the timing loop is tuned with relatively high flexibility to improve performance. On the other hand, the equalizer 134 can be tuned without compromise to constraints in the timing loop.

It is noted that the electronic system 100 can include other suitable components (not shown), such as a processor, a user input module, an audio/video module, and the like.

Figure 2:
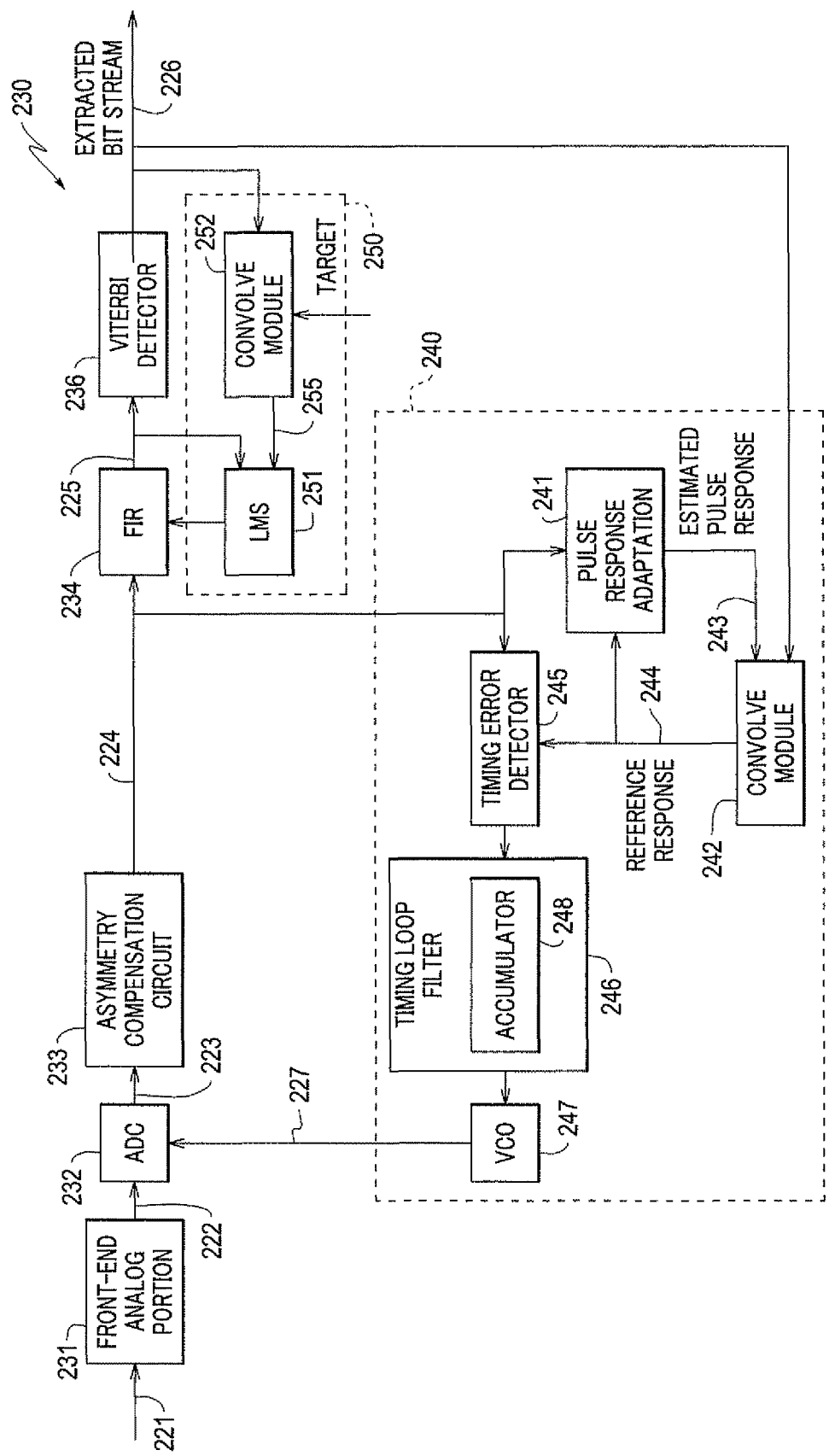
FIG. 2 shows a block diagram of a read channel example 230 according to an embodiment of the disclosure.

FIG. 2 shows a block diagram of a read channel example 230 according to an embodiment of the disclosure. The read channel 230 can be used in the electronic system 100 in the place of the read channel 130. The read channel 230 includes a front-end analog portion 231, an analog to digital converter (ADC) 232, an asymmetry compensation circuit 233, a FIR digital filter 234, a Viterbi detector 236, a timing module 240 and an adaptation controller 250. These elements are coupled together as shown in FIG. 2.

The read channel 230 utilizes certain components that are identical or equivalent to those used in the read channel 130, such as the front-end analog portion 231, the ADC 232, the asymmetry compensation circuit 233, and the Viterbi detector 236; the description of these components has been provided above and will be omitted here for clarity purposes.

The FIR digital filter 234 is configured to shape the frequency profile of the symmetric digital signal 224 to reduce noises from the symmetric digital signal 224 and control inter-symbol interferences. Specifically, the FIR digital filter 234 utilizes a plurality of coefficients to weight the symmetric digital signal 224 received at different sampling times to achieve suitable filter characteristic. Thus, data extraction based on the equalized digital signal 225 has a relatively high accuracy. In an example, the equalized digital signal 225 is referred to as the real channel response 225.

Further, the adaptation controller 250 adaptively adjusts the plurality of coefficients to improve the filter characteristic. In the FIG. 2 example, the adaptation controller 250 includes a convolve module 252 and a least mean square (LMS) module 251. The convolve module 252 convolves the extracted bit stream 226 with a target for the read channel 230 to generate a target channel response 255. According to an aspect of the disclosure, when the extracted bit stream is the same as the original bit stream, which is generally true, the extracted bit stream 226 is considered noise free. Then, the target channel response 255, having very low noise level, is considered noise free.

The LMS module 251 receives the real channel response 225 and the target channel response 255, and calculates a difference between the real channel response 225 and the target channel response 255. Further, the LMS module 251 uses a least mean square algorithm to adaptively adjust the coefficients of the FIR digital filter 234 to reduce the difference.

In an example, at each time interval, such as a specified number of sampling clocks, the coefficients of the FIR digital filter 234 are reconfigured to minimize mean squares of the difference between the real channel response 225 and the target channel response 255.

It is noted that, in an embodiment, the target is also adaptively adjusted. According to an aspect of the disclosure, hardware complexity of the FIR digital filter 234 and the adaptation controller 250 is a function of the target length, such as a number of taps of the target. When a relatively long target provides better filter characteristic, the long target can exponentially increase hardware complexity. Thus, in an example, a relatively short target, such as a three-tap target that includes three programmable registers, a four-tap target that includes four programmable registers, or the like, is used.

The timing module 240 includes a pulse response adaptation module 241, a convolve module 242, a timing error detector 245, a timing loop filter 246 and a voltage-controlled oscillator (VCO) 247. These elements are coupled together as shown in FIG. 2.

The pulse response adaptation module 241 provides an estimated pulse response 243 to the convolve module 242. The convolve module 242 convolves the estimated pulse response 243 with the extracted bit stream 226 to generate a reference response 244. According to an aspect of the disclosure, when the extracted bit stream 226 is the same as the original bit stream, which is generally true, the extracted bit stream is considered noise free. Then, the reference response 244, having very low noise level, is considered noise free.

The timing error detector 245 compares the symmetric digital signal 224 with the reference response 244, detects a timing error from the symmetric digital signal 224, and provides the timing error to the timing loop filter 246. The timing loop filter 246 operates on the timing error and generates a signal to control the VCO 247. In an example, the timing loop filter 246 includes an accumulator 248 and other suitable circuit components (not shown) that operate on the timing error.

In an example, the timing module 240 includes a digital-to-analog converter (not shown) to convert the output from the timing loop filter 246 to a voltage signal. Then, the voltage signal is used to control the VCO 247, and to adjust the sampling clock 227.

In an example, the timing error (E) is calculated based on the symmetric digital signal 224 (X) and the reference response 244 (Y) according to Eq. 1:

$$E(i) = \begin{cases} X(i) - Y(i) & \text{if } Y(i-1) > Y(i+1) \\ Y(i) - X(i) & \text{if } Y(i-1) < Y(i+1) \\ 0 & \text{if } Y(i-1) = Y(i+1) \end{cases} \quad \text{Eq. 1}$$

where E(i) denotes timing error at time i, X(i) denotes the symmetric digital signal 224 at time i and Y(i) denotes the reference response 244 at time i.

In an embodiment, the pulse response adaptation module 241 also receives both the reference response 244 and the symmetric digital signal 224, and adaptively adjusts the estimated pulse response 243.

According to an aspect of the disclosure, the timing loop of the read channel 230 (including the timing module 240, the ADC 232, and the asymmetry compensation circuit 233) and the adaptation loop of the read channel 230 (including the FIR digital filter 234 and the adaptation controller 250) are decoupled, such that the two loops do not interact with each other. Thus, the timing loop and the adaptation loop can be separately tuned to achieve respective benefits.

In an embodiment, the estimated pulse response 243 includes a relatively large number of coefficients to more accurately estimate the pulse response of the channel, and improve the timing loop. At the same time, a relatively short target can be used to reduce hardware complexity of the read channel 230.

In an example, the estimated pulse response 243 includes five coefficients P0-P4. Then, the reference response 244 at time i (Y(i)) is calculated according to Eq. 2:

$Y(i)=B(i)\times P0+B(i-1)\times P+B(i-2)\times P2+B(i-3)\times P3+B(i-4)\times P4$     Eq. 2 where B(i) denotes the extracted bit stream 226 at time i. It is noted that the estimated pulse response 243 can use any number of coefficients. The number of coefficients is not limited by the target length. In an example, the estimated pulse response 243 includes a relatively large number of coefficients to improve timing loop performance.

Further, the five coefficients P0-P4 are adaptively adjusted. It is noted that any suitable adaptation method can be used. In an example, the five coefficients P0-P4 are adaptively adjusted according to Eq. 3-Eq. 8:

$\text{error}=Y(i)-X(i)$     Eq. 3

$P0(i+1)=P0(i)-m\times\text{error}\times B(i)$     Eq. 4

$P1(i+1)=P1(i)-m\times\text{error}\times B(i-1)$     Eq. 5

$P2(i+1)=P2(i)-m\times\text{error}\times B(i-2)$     Eq. 6

$P3(i+1)=P3(i)-m\times\text{error}\times B(i-3)$     Eq. 7

$P4(i+1)=P4(i)-m\times\text{error}\times B(i-4)$     Eq. 8 where m denotes adaptation gain.

According to an embodiment of the disclosure, the Eq. 4-Eq. 8 can be simplified. In an example, error is replaced by sign of error, and the sign of error can be 1, 0 or −1. Further, the extracted bit stream 226 is either 1 or −1. When the adaptation gain is 1, the change for each of the P0-P4 is one of 1, 0 and −1 at every update. Thus, the adaptation for P0-P4 can be implemented using simple circuits, such as counters, and the like.

According to an embodiment of the disclosure, the adaptation of the estimated pulse response may respond to the timing errors, and one or more constraints can be applied to avoid the adaptation to the timing errors.

In an example, P3 is constrained to equal P1, and P4 is constrained to equal P0. P0-P4 are adaptively adjusted according to Eq. 9-Eq. 13:

$$P0(i+1)=P0(i)-m\times SIGN(error)\times B(i) \qquad \text{Eq. 9}$$

$$P1(i+1)=P1(i)-m\times SIGN(error)\times B(i-1) \qquad \text{Eq. 10}$$

$$P2(i+1)=P2(i)-m\times SIGN(error)\times B(i-2) \qquad \text{Eq. 11}$$

$$P3(i+1)=P1(i+1) \qquad \text{Eq. 12}$$

$$P4(i+1)=P0(i+1) \qquad \text{Eq. 13}$$

where SIGN(error) denotes the sign of error.

In another example, the adaptation is further improved to avoid adaptation to timing errors. P0-P4 are adaptively adjusted according to Eq. 14-Eq. 18:

$$P0(i+1)=P0(i)-m\times SIGN(error)\times (B(i)+B(i-4)) \qquad \text{Eq. 14}$$

$$P1(i+1)=P1(i)-m\times SIGN(error)\times (B(i-1)+B(i-3)) \qquad \text{Eq. 15}$$

$$P2(i+1)=P2(i)-m\times SIGN(error)\times B(i-2) \qquad \text{Eq. 16}$$

$$P3(i+1)=P1(i+1) \qquad \text{Eq. 17}$$

$$P4(i+1)=P0(i+1) \qquad \text{Eq. 18}$$

In an embodiment, all the components in the read channel 230 are implemented using circuits. In another embodiment, some components, such as the LMS 251, and the like, are implemented as a processor executing software instructions.

Figure 3A:
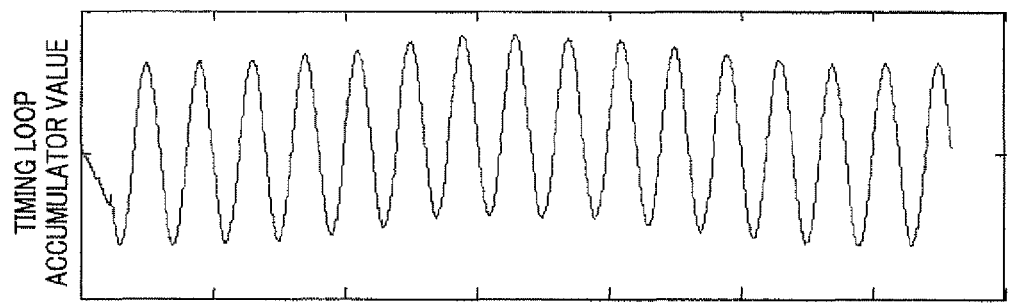
FIGS. 3A-3C show simulation plots for the read channel 230 according to an embodiment of the disclosure.
Figure 3B:
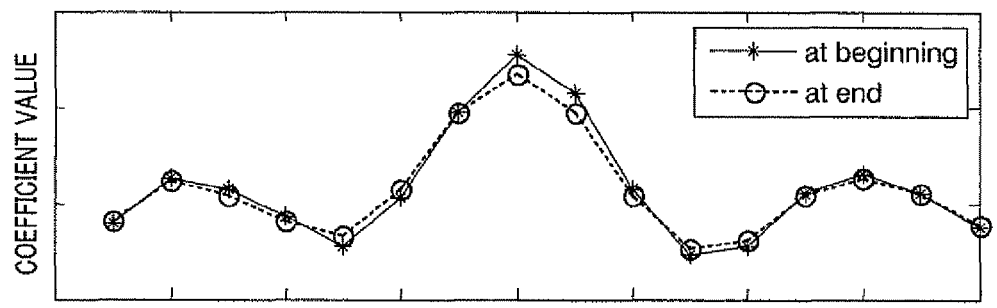
Figure 3C:
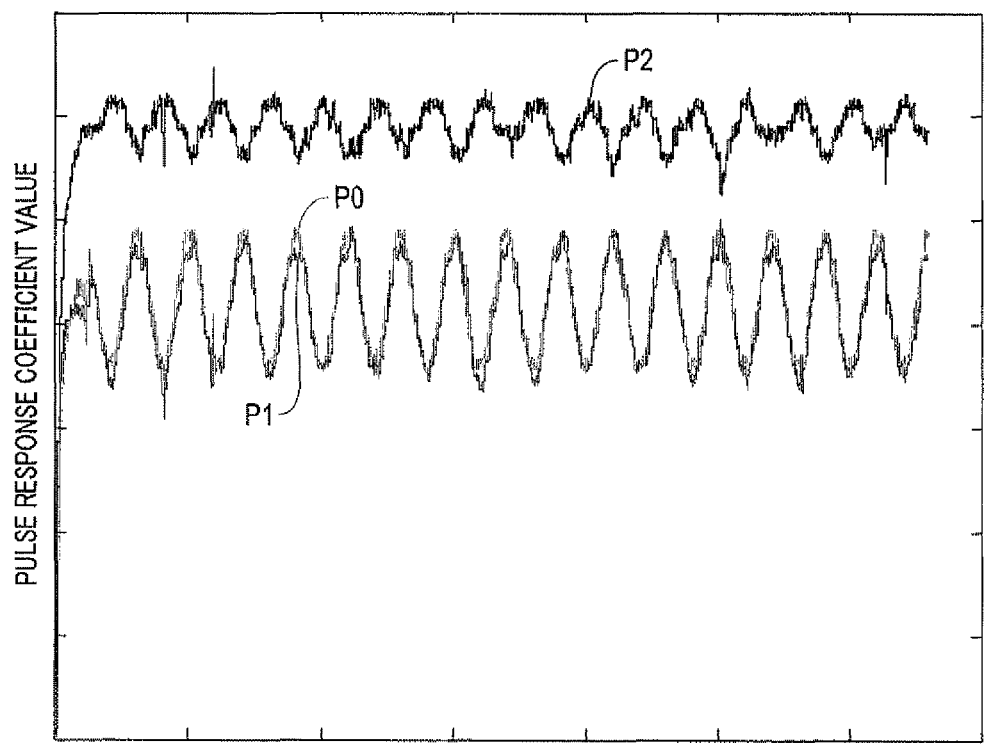

FIGS. 3A-3C show simulation plots for the read channel 230 according to an embodiment of the disclosure. In the embodiment, the pulse response adaptation module 241 adaptively adjusts the five coefficients P0-P4 according to Eq. 9-Eq. 13.

During the simulation, frequency drift is intentionally added to the input signal, such as the electrical signal 221, to the read channel 230. In an example, a waveform is previously captured in response to reading a Blu-ray disc. The waveform is suitably stored. Then, the frequency drift is added into the waveform to generate the input signal to the read channel 230. In the FIGS. 3A-3C example, sinusoidal frequency drift is added into the waveform.

In FIG. 3A, X-axis indicates time, and Y-axis indicates accumulator value in the timing loop, such as an accumulated value in the accumulator 248. FIG. 3A shows that the accumulator value changes in a sinusoidal manner. Thus, the timing loop tracks the frequency shift in the input signal to the read channel 230, and corrects timing error due to the frequency shift.

In FIG. 3B, X-axis indicates indexes for FIR coefficients, and Y-axis indicates coefficient values. In the embodiment, the FIR digital filter 234 includes 16 coefficients. The coefficients are adaptively adjusted to improve the filter characteristic. FIG. 3B shows the values of the coefficients at the beginning and at the end of the simulation. Because the timing loop and the adaptation loop are decoupled and do not interact with each other, the adaptation loop does not respond to timing error, and the values of the coefficients are about the same at the beginning and at the end of the simulation.

In a comparison example that a timing loop uses the equalized digital signal to detect the timing error, the FIR coefficients change significantly in response to the timing error. For example, the index with the largest value may shift.

In FIG. 3C, X-axis indicates time, and Y-axis indicates pulse response coefficient values for P0, P1 and P2. It is noted that P3 is constrained to be the same as P1, and P4 is constrained to be the same as P0. FIG. 3C shows that the pulse response coefficients change in a sinusoidal manner.

Figure 4A:
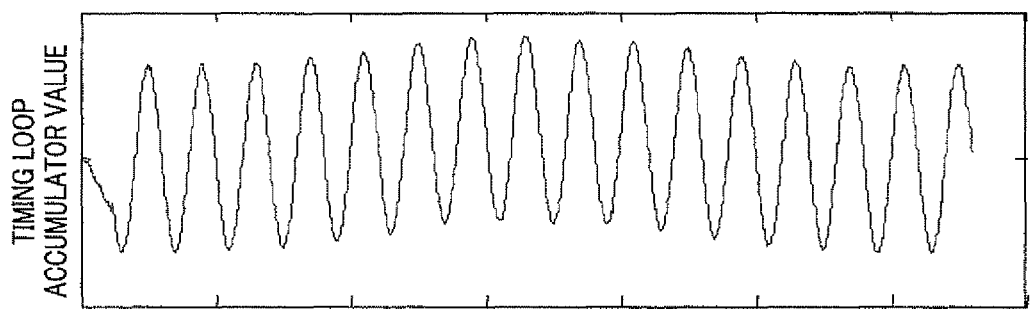
FIGS. 4A-4C show simulation plots for the read channel 230 according to another embodiment of the disclosure.
Figure 4B:
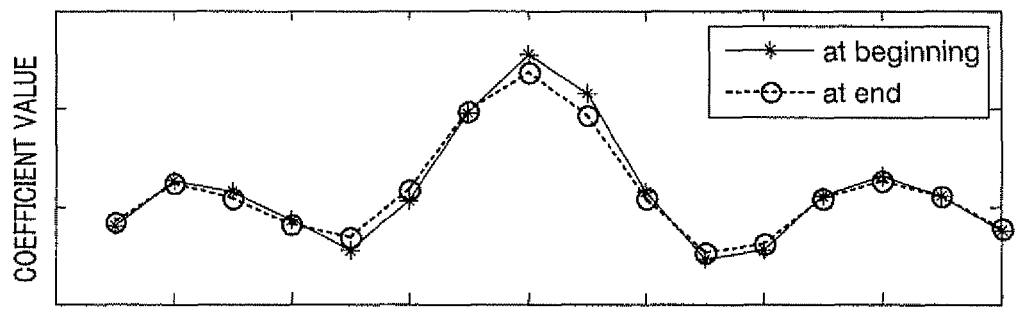
Figure 4C:
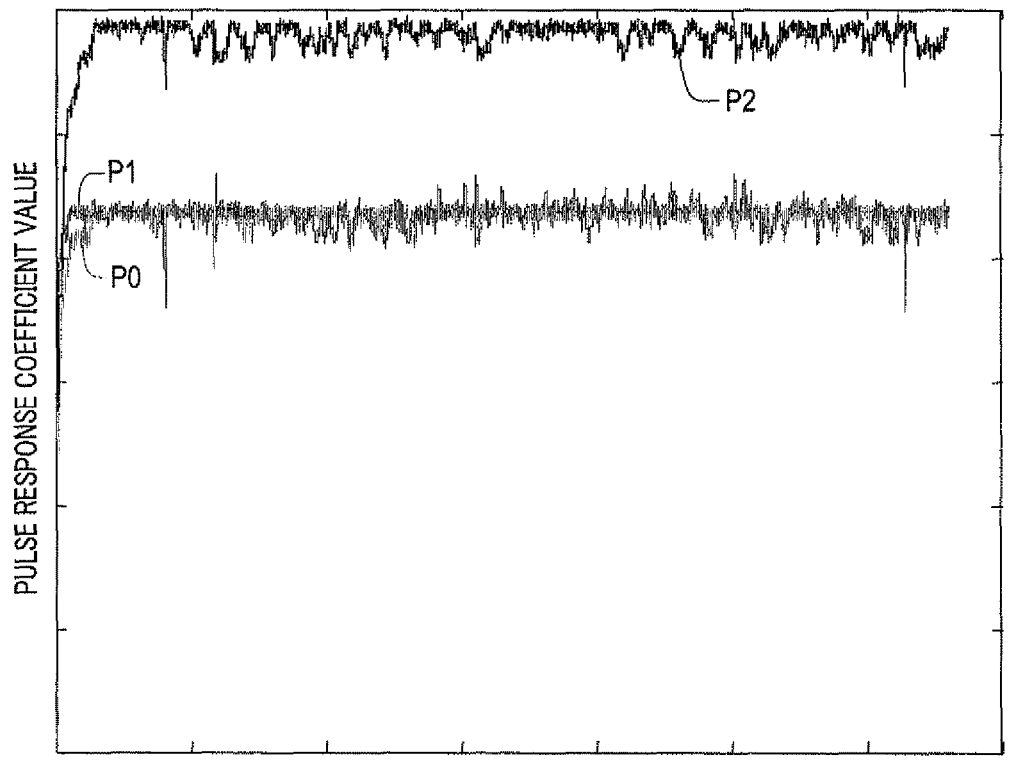

FIGS. 4A-4C show simulation plots for the read channel 230 according to another embodiment of the disclosure. In this embodiment, the pulse response adaptation module 241 adaptively adjusts the five coefficients P0-P4 according to Eq. 14-Eq. 18.

During the simulation, the input signal to the read channel 230 is generated in the same manner as the simulation in FIGS. 3A-3C. FIGS. 4A-4B show similar results as FIGS. 3A-3B; the description of these plots has been provided above and will be omitted here for clarity purposes.

In FIG. 4C, X-axis indicates time, and Y-axis indicates pulse response coefficient value for P0, P1 and P2. It is noted that P3 is constrained to be the same as P1, and P4 is constrained to be the same as P0. FIG. 4C shows that the pulse response coefficients do not change in a sinusoidal manner. Thus, the embodiment according to Eq. 14-Eq. 18 improves the pulse response adaptation from Eq. 9-Eq. 13 to avoid adaptation of the pulse response coefficients to timing errors.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A signal processing circuit, comprising:
   an analog to digital converter (ADC) configured to receive an analog signal, sample the analog signal based on a sampling clock signal, and convert the sampled analog signal into a digital signal;
   an equalizer configured to equalize the digital signal;
   a detector configured to detect a bit stream from the equalized digital signal; and
   a first convolve module configured to convolve the bit stream with a pulse response of the signal processing circuit to generate a first convolved signal;
   a timing module configured to detect a timing error based on the digital signal before being equalized and the first convolved signal, and to adjust the sampling clock signal based on the timing error.

2. The signal processing circuit of claim 1, wherein the timing module further comprises:
   a timing error detector configured to detect the timing error based on a difference between the digital signal before being equalized and the first convolved signal.

3. The signal processing circuit of claim 2, wherein the timing module further comprises:
   a pulse response adaptation module configured to adapt the pulse response based on the first convolved signal and the digital signal before being equalized.

4. The signal processing circuit of claim 3, wherein the pulse response adaptation module is configured to avoid adaptation to the timing error.

5. The signal processing circuit of claim 2, wherein
the equalizer includes a finite impulse response (FIR) digital filter; and
an adaptation controller is configured to adaptively adjust coefficients of the FIR digital filter based on the equalized digital signal.

6. The signal processing circuit of claim 5, wherein the adaptation controller further comprises a second convolve module configured to convolve the bit stream with a target to generate a second convolved signal, and the adaptation controller is configured to adaptively adjust the coefficients of the FIR digital filter based on the equalized digital signal and the second convolved signal.

7. The signal processing circuit of claim 6, wherein the adaptation controller is configured to adaptively adjust the coefficients of the FIR digital filter to achieve least mean squares between the equalized digital signal and the second convolved signal.

8. A method, comprising:
receiving an analog signal;
sampling and converting, based on a sampling clock signal, the analog signal into a digital signal;
equalizing the digital signal;
detecting a bit stream from the equalized digital signal;
convolving the bit stream with a pulse response to generate a first convolved signal;
detecting a timing error based on the digital signal before being equalized and the first convolved signal; and
adjusting the sampling clock signal based on the timing error.

9. The method of claim 8, further comprising:
detecting the timing error based on a difference between the digital signal before being equalized and the first convolved signal.

10. The method of claim 9, further comprising:
adapting the pulse response based on the first convolved signal and the digital signal before being equalized.

11. The method of claim 10, wherein adapting the pulse response based on the first convolved signal and the digital signal before being equalized further comprises:
constraining the pulse response adaptation to avoid adaptation to the timing error.

12. The method of claim 9, wherein equalizing the digital signal further comprises:
adaptively adjusting coefficients of a finite impulse response (FIR) digital filter.

13. The method of claim 12, wherein adaptively adjusting the coefficients of the FIR digital filter further comprises:
convolving the bit stream with a target to generate a second convolved signal; and
adaptively adjusting the coefficients based on the equalized digital signal and the second convolved signal.

14. The method of claim 13, wherein adaptively adjusting the coefficients based on the equalized digital signal and the second convolved signal further comprises:
adaptively adjusting the coefficients to achieve least mean squares between the equalized digital signal and the second convolved signal.

15. An electronic system, comprising:
a pick-up unit configured to generate an electrical signal corresponding to a bit stream;
an analog signal processing circuit configured to generate an analog signal based on the electrical signal;
an analog to digital converter (ADC) configured to sample the analog signal based on a sampling clock signal, and convert the sampled analog signal into a digital signal;
an equalizer configured to equalize the digital signal;
a detector configured to detect a bit stream from the equalized digital signal; and
a first convolve module configured to convolve the bit stream with a pulse response of the signal processing circuit to generate a first convolved signal;
a timing module configured to detect a timing error based on the digital signal before being equalized and the first convolved signal, and to adjust the sampling clock signal based on the timing error.

16. The signal processing circuit of claim 15, wherein the timing module further comprises:
a timing error detector configured to detect the timing error based on a difference between the digital signal before being equalized and the first convolved signal.

17. The signal processing circuit of claim 16, wherein the timing module further comprises:
a pulse response adaptation module configured to adapt the pulse response based on the first convolved signal and the digital signal before being equalized.

18. The signal processing circuit of claim 17, wherein the pulse response adaptation module is configured to avoid adaptation to the timing error.

19. The signal processing circuit of claim 16, wherein
the equalizer includes a finite impulse response (FIR) digital filter; and
an adaptation controller is configured to adaptively adjust coefficients of the FIR digital filter based on the equalized digital signal.

20. The signal processing circuit of claim 19, wherein the adaptation controller further comprises a second convolve module configured to convolve the bit stream with a target to generate a second convolved signal, and the adaptation controller is configured to adaptively adjust the coefficients of the FIR digital filter to achieve least mean squares between the equalized digital signal and the second convolved signal.

* * * * *